United States Patent [19]

Murahashi

[11] Patent Number: 5,309,043

[45] Date of Patent: May 3, 1994

[54] COMPOUND LOGIC CIRCUIT HAVING NAND AND NOR GATE OUTPUTS AND TWO TRANSISTORS CONNECTED WITHIN BOTH GATE CIRCUITS

[75] Inventor: Shunichi Murahashi, Nabari, Japan

[73] Assignee: Sharp Kabushiki Kaisha, Osaka, Japan

[21] Appl. No.: 722,475

[22] Filed: Jul. 2, 1991

[30] Foreign Application Priority Data

Jul. 11, 1990 [JP] Japan .................. 2-183521

[51] Int. Cl.⁵ .................. H03K 19/094; H03K 19/20
[52] U.S. Cl. .................. 307/451; 307/465; 307/449; 307/454
[58] Field of Search ............... 307/449, 450, 451, 465, 307/469, 467, 466, 455, 454

[56] References Cited

U.S. PATENT DOCUMENTS

| | | | |
|---|---|---|---|
| 3,016,466 | 1/1962 | Richards | 307/455 |
| 3,248,561 | 4/1966 | Walsh | 307/455 |
| 3,691,401 | 9/1972 | Forlani et al. | 307/448 |
| 3,769,523 | 10/1973 | Suzuki | 307/451 |
| 3,772,536 | 11/1973 | Grannis et al. | 307/448 |
| 3,980,897 | 9/1976 | Arnold | 307/469 |
| 4,185,209 | 1/1980 | Street | 307/451 |
| 4,417,161 | 11/1983 | Uya | 307/451 |
| 4,507,574 | 3/1985 | Seki et al. | 307/451 |
| 4,518,875 | 5/1985 | Aytac | 307/451 |

*Primary Examiner*—Edward P. Westin
*Assistant Examiner*—Richard Roseen
*Attorney, Agent, or Firm*—Nixon & Vanderhye

[57] ABSTRACT

A compound logic circuit including one NAND gate constituted by two p-channel transistors and two n-channel transistors and one NOR gate constituted by two p-channel transistors and two n-channel transistors. The compound logic circuit is characterized by one of the two p-channel transistors contained in the NAND gate being used as one of the two p-channel transistors contained in the NOR gate and one of the two n-channel transistors contained in the NAND gate being used as one of the two n-channel transistors contained in the NOR gate.

16 Claims, 2 Drawing Sheets

COMPOUND LOGIC CIRCUIT HAVING NAND AND NOR GATE OUTPUTS AND TWO TRANSISTORS CONNECTED WITHIN BOTH GATE CIRCUITS

BACKGROUND OF THE INVENTION

1. Field of the Invention

The present invention relates to a compound logic circuit which is composed of a NAND gate circuit and a NOR gate circuit.

2. Description of the Related Art

For example, consider a compound logic circuit formed on one integrated circuit chip. In case the compound logic circuit is composed of a NAND gate circuit and a NOR gate circuit both of which is formed of CMOS transistors, in general, the NAND gate circuit is formed of quite different transistors from the NOR gate circuit.

FIG. 2 is a circuit diagram showing this type of compound logic circuit composed of a NAND gate circuit and a NOR gate circuit according to the related art of the invention.

As shown in the upper part of FIG. 2, one NAND gate circuit 10 is composed of four transistors 11 to 14, that is, two p-channel MOS transistors 11, 12 (referred to as a PMOS transistor) and two n-channel MOS transistors 13, 14 (referred to as a NMOS transistor).

AS shown in the lower part of FIG. 2, one NOR gate circuit 20 is also composed of four transistors 21 to 24, that is, two PMOS transistors 21, 22 and two NMOS transistors 23, 24.

As will be obvious from FIG. 2, the NAND gate circuit 10 is composed of the dedicated transistors which are independent of the transistors composing the NOR gate circuit 20.

This type of compound logic circuit according to the related art of the invention requires each two PMOS transistors and each two NMOS transistors, that is, eight transistors in total for composing one NAND gate circuit and one NOR gate circuit. It means that the type of compound logic circuit needs a larger area on the integrated circuit chip occupied by the compound logic circuit.

SUMMARY OF THE INVENTION

It is therefore an object of the present invention to provide a compound logic circuit which needs a less area on the integrated circuit chip occupied by the compound logic circuit itself.

In carrying out the object in a preferred mode, the present invention provides a compound logic circuit which includes a NAND gate comprising two p-channel transistors and two n-channel transistors and a NOR gate comprising two p-channel transistors and two n-channel transistors, one of the two p-channel transistors contained in the NAND gate being same as one of the two p-channel transistors contained in the NOR gate, and one of the two n-channel transistors contained in the NAND gate being same as one of the two n-channel transistors contained in the NOR gate.

According to the compound logic circuit of the present invention, as stated above, one of the p-channel transistors contained in the NAND gate circuit is the same as one of the p-channel transistors contained in the NOR gate circuit and one of the n-channel transistors contained in the NAND gate circuit is the same as one of the n-channel transistors contained in the NOR gate circuit. The present compound logic circuit needs only six transistors though it has a NAND gate circuit and a NOR gate circuit like the foregoing related art, resulting in reducing its occupation area on the integrated circuit chip area.

Further objects and advantages of the present invention will be apparent from the following description, reference being had to the accompanying drawings wherein a preferred embodiment of the present invention is clearly shown.

DESCRIPTION OF THE PREFERRED EMBODIMENT

Figure 1:
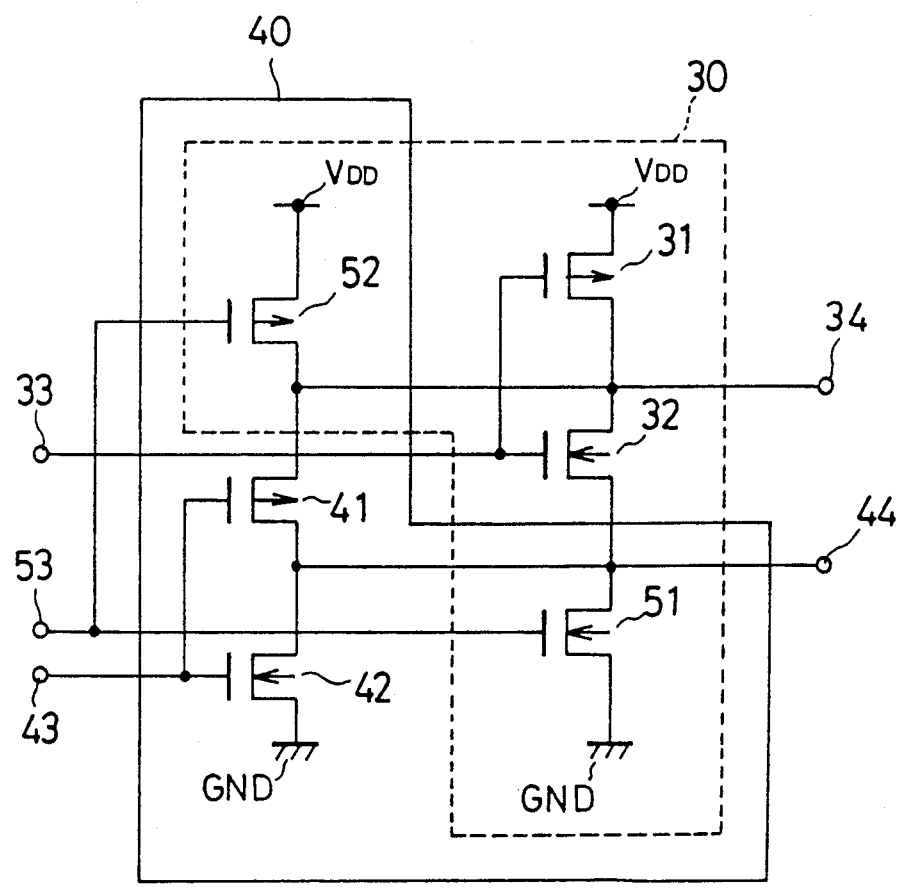
FIG. 1 is a circuit diagram showing a compound logic circuit according to an embodiment of the present invention.
Figure 2:
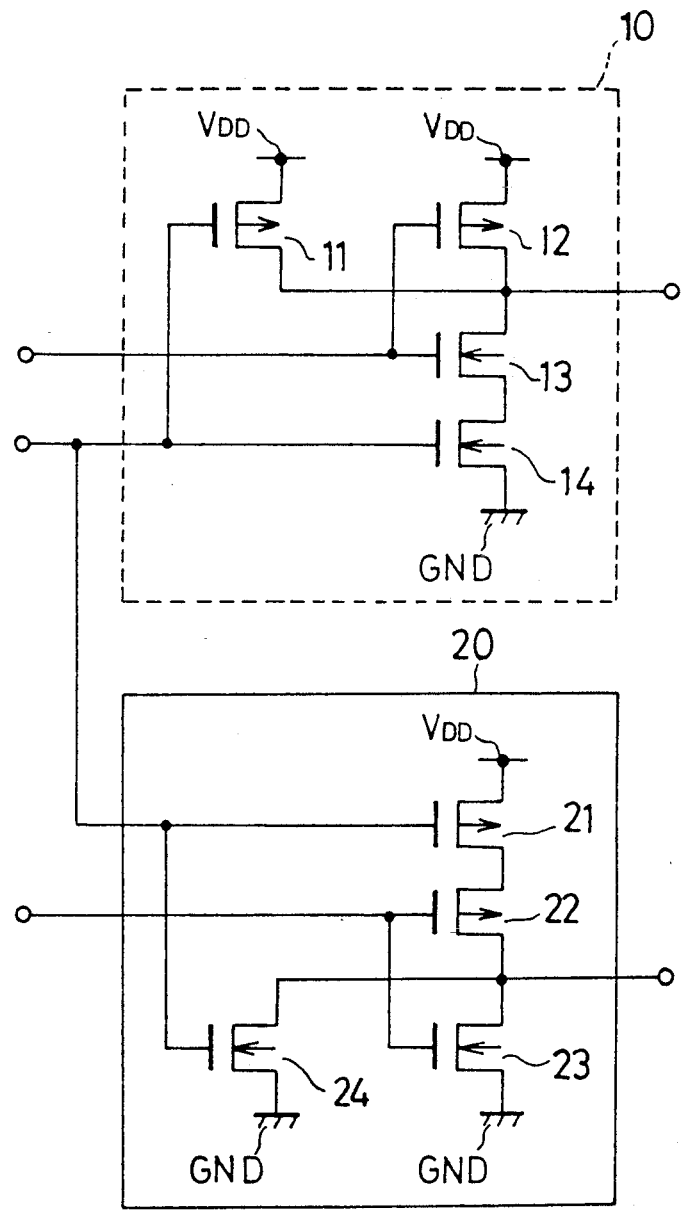
FIG. 2 is a circuit diagram showing a compound logic circuit according to a related art of the present invention.

FIG. 1 is a circuit diagram showing a compound logic circuit according to an embodiment of the present invention.

As shown, between a supply voltage line VDD and a ground wire is connected a circuit which includes a PMOS transistor 31, an NMOS transistor 32, and an NMOS transistor 51 connected in series in the referenced sequence. Between the supply voltage line VDD and the ground wire is also connected a circuit which includes a PMOS transistor 52, a PMOS transistor 41, and an NMOS transistor 42 connected in series in the referenced sequence.

A contact point between the PMOS transistor 31 and the NMOS transistor 32 is connected to a contact point between the PMOS transistor 52 and the PMOS transistor 41.

Likewise, a contact point between the NMOS transistor 32 and the NMOS transistor 51 is connected to a contact point between the PMOS transistor 41 and the NMOS transistor 42.

A NAND gate circuit 30 is composed of the PMOS transistor 31, the NMOS transistor 32, the NMOS transistor 51, and the PMOS transistor 52.

Likewise, a NOR gate circuit 40 is composed of the PMOS transistor 52, the PMOS transistor 41, the NMOS transistor 42, and the NMOS transistor 51.

As will be appreciated from the above description, the NMOS transistor 51 and the PMOS transistor 52 are used in both the NAND gate circuit 30 and the NOR gate circuit 40.

The NAND gate circuit 30 includes two input terminals, that is, an input terminal 33 connected to the gate electrodes of the PMOS transistor 31 and the NMOS transistor 32 and a common input terminal 53 connected to the gate electrodes of the NMOS transistor 51 and the PMOS transistor 52 commonly used in the NOR gate circuit 40. The NAND gate circuit 30 supplies an output at an output terminal 34 connected to the contact point between the PMOS transistor 31 and the NMOS transistor 32.

The NOR gate circuit 40 includes two input terminals, that is, an input terminal 43 connected to the gate electrodes of the PMOS transistor 41 and the NMOS transistor 42 and the common input terminal 53. The NOR gate circuit 40 supplies an output at an output terminal 44 connected to the contact between the NMOS transistor 32 and the NMOS transistor 51.

In the present embodiment, as stated above, the NMOS transistor 51 and the PMOS transistor 52 are commonly used in both the NAND gate circuit 30 and the NOR gate circuit 40 and the number of the transistors is reduced accordingly. It results in reducing the occupation area of the compound logic circuit on the integrated circuit chip.

Then, the description will be directed to how the compound logic circuit operates.

At first, the NAND gate circuit 30 will be described.

Assume that a logic signal of "0" level is applied to the input terminal 33 and the common input terminal 53. In this case, the PMOS transistor 31 and the commonly used PMOS transistor 52 are both switched on and the NMOS transistor 32 and the commonly used NMOS transistor 51 are both switched off. As a result, a voltage close to the supply voltage VDD appears on the output terminal 34 so that the logic signal of "1" level is supplied at the output terminal 34.

Assume that a logic signal of "0" is applied to the input terminal 33 and a logic signal of "1" is applied to the commonly used terminal 53. In this case, the PMOS transistor 31 is switched on, the commonly used PMOS transistor 52 is switched off, the NMOS transistor 32 is switched off, and the commonly used NMOS transistor 51 is switched on. As a result, a voltage close to the supply voltage VDD appears at the output terminal 34 so that a logic signal of "1" is supplied at the output terminal 34.

Assume that a logic signal of "1" is applied to the input terminal 33 and a logic signal of "0" is applied to the common input terminal 53. In this case, the PMOS transistor 31 is switched off, the commonly used PMOS transistor 52 is switched on, the NMOS transistor 32 is switched on, and the commonly used NMOS transistor 51 is switched off. As a result, a voltage close to the supply voltage VDD appears at the output terminal 34 so that a logic signal of "1" level is supplied at the output terminal 34.

Assume that a logic signal of "1" is applied to the input terminal 33 and a logic signal of "1" is applied to the common input terminal 53. In this case, the PMOS transistor 31 and the commonly used PMOS transistor 52 are both switched off and the NMOS transistor 32 and the commonly used NMOS transistor 51 are both switched off. As a result, a voltage close to a ground voltage appears at the output terminal 34 so that the logic signal of "0" level is supplied at the output terminal 34.

Next, the NOR gate circuit 40 will be described.

Assume that a logic signal of "0" is applied to the input terminal 43 and a logic signal of "0" is applied to the common input terminal 53. In this case, the PMOS transistor 41 and the commonly used PMOS transistor 52 are both switched on and the NMOS transistor 42 and the commonly used NMOS transistor 51 are both switched off. As a result, the voltage close to the supply voltage VDD appears at the output terminal 44 so that the logic signal of "1" level is supplied at the output terminal 44.

Assume that a logic signal of "0" is applied to the input terminal 43 and a logic signal of "1" is applied to the common input terminal 53. In this case, the PMOS transistor 41 is switched on, the commonly used PMOS transistor 52 is switched off, the NMOS transistor 42 is switched off, and the commonly used NMOS transistor 51 is switched on. As a result, a voltage close to the earth voltage appears at the output terminal 44 so that a logic signal of "0" level is supplied at the output terminal 44.

Assume that a logic signal of "1" is applied to the input terminal 43 and a logic signal of "0" is applied to the common input terminal 53. In this case, the PMOS transistor 41 is switched off, the commonly used PMOS transistor 52 is switched on, the NMOS transistor 42 is switched on, and the commonly used NMOS transistor 51 is switched off. As a result, a voltage close to the ground voltage appears at the output terminal 44 so that a logic signal of "1" level is supplied at the output terminal 44.

Assume that a logic signal of "1" is applied to the input terminal 43 and a logic signal of "1" is applied to the common input terminal 53. In this case, the PMOS transistor 41 and the commonly used PMOS transistor 52 are both switched off and the NMOS transistor 42 and the commonly used NMOS transistor 51 are both switched on. As a result, a voltage close to the earth voltage appears at the output terminal 44 so that the logic signal of "0" level is supplied at the output terminal 44.

Many widely different embodiments of the present invention may be constructed without departing from the spirit and scope of the present invention. It should be understood that the present invention is not limited to the specific embodiment described in this specification, except as defined in the appended claims.

What is claimed is:

1. A compound logic circuit comprising:
   a NAND gate and a NOR gate, wherein said NAND gate includes:
   a first p-channel transistor having one terminal connected to a first electric potential, a gate connected to a first input terminal of said compound logic circuit, and the other terminal connected to a first output terminal of said compound logic circuit;
   a first n-channel transistor having one terminal connected to said first output terminal, a gate connected to said first input terminal, and the other terminal connected to a second output terminal of said compound logic circuit;
   a second n-channel transistor having one terminal connected to said second output terminal, a gate connected to a second input terminal of said compound logic circuit and the other terminal connected to a second electric potential; and
   a second p-channel transistor having one terminal connected to said first electric potential, a gate connected to said second input terminal, and the other terminal connected to said first output terminal, and
   said NOR gate includes:
   said second p-channel transistor;
   said second n-channel transistor;
   a third p-channel transistor having one terminal connected to said first output terminal, a gate connected to a third input terminal of said compound logic circuit, and the other terminal connected to said second output terminal; and
   a third n-channel transistor having one terminal connected to said second output terminal, a gate connected to said third input terminal, and the other terminal connected to said second electric potential.

2. A compound logic circuit according to claim 1, wherein said NAND gate and said NOR gate are formed on one semiconductor chip.

3. A compound logic circuit according to claim 1, wherein said first electric potential is higher than said second electric potential.

4. A single integrated chip compound logic circuit performing logic NOR and NAND operations, comprising:
   three input terminals for receiving input signals and two output terminals for generating logically operated signals and
   at most six transistors connected to the three input and two output terminals,
   two of the transistors being connected as a part of a NOR gate to perform the logic NOR operations on input signals received at a first pair of the three input terminals and as a part of a NAND gate to perform the logic NAND operation on input signals received at a second, different pair of the three input terminals,
   wherein the input signals received at both the NOR and NAND gates have the same logic polarity type.

5. A compound logic circuit according to claim 4, wherein a first group of four of the transistors are connected as the NOR gate and a second group of four of the transistors are connected as the NAND gate.

6. A compound logic circuit according to claim 5, wherein both the first and second groups include two P-type transistors and two N-type transistors.

7. A compound logic circuit according to claim 4, wherein first and second transistors having different conductivity types are connected to operate as a part of the NOR gate and as a part of the NAND gate.

8. A compound logic circuit according to claim 7, wherein each of said first and second transistors includes a gate commonly connected to a first input terminal.

9. A compound logic circuit according to claim 8, wherein said first transistor has one terminal connected to an output terminal of said NAND gate, and said second transistor has one terminal connected to an output terminal of said NOR gate.

10. A compound logic circuit according to claim 9, wherein third and fourth transistors having different conductivity types are serially connected to said first transistor as a part of said NOR gate, and wherein fifth and sixth transistors having different conductivity types are serially connected to said second transistor.

11. A compound logic circuit according to claim 10, wherein each of said third and fourth transistors includes a gate connected to a second input terminal, and each of said fifth and sixth transistors includes a gate connected to a third input terminal.

12. A compound logic circuit according to claim 11, wherein said third and fourth transistors are connected to said output terminal of said NOR gate together with said one terminal of said second transistor, and said fifth and sixth transistors are connected to said output terminal of said NAND gate together with said one terminal of said first transistor.

13. A compound logic circuit according to claim 12, wherein said first transistor has another terminal connected to a first potential, and said second transistor has another terminal connected to a second electric potential.

14. A compound logic circuit according to claim 13, wherein said first potential is higher than said second electric potential.

15. A compound logic circuit according to claim 14, wherein said first, third, and fifth transistors are P-channel transistors and said second, fourth and sixth transistors are N-channel transistors.

16. A single integrated chip compound logic circuit for performing logic NOR and NAND operations, comprising:
   three input and two output terminals and a power supply terminal;
   at most three N-channel transistors and at most three P-channel transistors connected to the three input and two output terminals and to the power supply terminal;
   a NAND gate formed from a first group of two of the N-channel transistors and a first group of two of the P-channel transistors connected to perform a NAND operation on input signals received at a first pair of the three input terminals and to generate an output signal on one of the output terminals; and
   a NOR gate formed from a second group of two of the N-channel transistors and a second group of two of the P-channel transistors connected to perform a NOR operation on input signals received at a second, different pair of the three input terminals and to generate an output signal on the other of the output terminals,
   wherein the input signals received at the input terminal of both the NAND gate and the NOR gate have the same logic polarity type.

* * * * *